United States Patent
Jung et al.

(10) Patent No.: US 11,803,000 B2
(45) Date of Patent: Oct. 31, 2023

(54) OPTICAL FILTER AND DISPLAY DEVICE INCLUDING THE SAME

(71) Applicant: SAMSUNG DISPLAY CO., LTD., Yongin-si (KR)

(72) Inventors: Minsik Jung, Yongin-si (KR); Ohjeong Kwon, Yongin-si (KR); Sanggyun Kim, Yongin-si (KR); Byoungseong Jeong, Yongin-si (KR); Minju Han, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/352,903

(22) Filed: Jun. 21, 2021

(65) Prior Publication Data
US 2021/0311232 A1     Oct. 7, 2021

Related U.S. Application Data

(63) Continuation of application No. 16/725,090, filed on Dec. 23, 2019, now Pat. No. 11,041,981.

(30) Foreign Application Priority Data

Jan. 8, 2019   (KR) .................. 10-2019-0002406

(51) Int. Cl.
*G02F 1/13357*   (2006.01)
*G02B 5/20*   (2006.01)
(Continued)

(52) U.S. Cl.
CPC ....... *G02B 5/201* (2013.01); *G02F 1/133514* (2013.01); *G02F 1/133617* (2013.01); *H10K 59/38* (2023.02)

(58) Field of Classification Search
CPC ............... G02B 5/201; G02F 1/133514; G02F 1/133617; H01L 27/322
See application file for complete search history.

(56) References Cited

U.S. PATENT DOCUMENTS 6,091,195 A   7/2000   Forrest et al.
8,129,809 B2  3/2012   Jang
(Continued)

FOREIGN PATENT DOCUMENTS

JP   2013-246303   9/2013
KR   10-0726133    6/2007
(Continued)

OTHER PUBLICATIONS

G. Gu et al., "High-external-quantum-efficiency organic light-emitting devices", Optics Letters, vol. 22, No. 6, Mar. 15, 1997, pp. 396-398.

(Continued)

*Primary Examiner* — James A Dudek
(74) *Attorney, Agent, or Firm* — F. Chau & Associates, LLC

(57) ABSTRACT

An optical filter includes a substrate including a plurality of pixel areas spaced apart from each other and a light-blocking area between the plurality of pixel areas, a plurality of color filters arranged on a first surface of the substrate and corresponding to the plurality of pixel areas, and a plurality of conversion layers arranged on the first surface of the substrate and corresponding to the plurality of color filters. Each of the conversion layers includes inclined side surfaces. The optical filter further includes a reflective layer on the inclined side surfaces of each of the plurality of conversion layers. The reflective layer extends to the light-blocking area and is arranged consecutively on two adjacent inclined side surfaces from among the inclined side surfaces (Continued)

of the plurality of conversion layers and the light-blocking area between the two adjacent inclined side surfaces.

20 Claims, 7 Drawing Sheets

(51) Int. Cl.
*G02F 1/1335* (2006.01)
*H10K 59/38* (2023.01)

(56) References Cited

U.S. PATENT DOCUMENTS

| | | | |
|---|---|---|---|
| 10,185,066 B2 | 1/2019 | Chae et al. | |
| 2003/0156236 A1* | 8/2003 | Yamada | G02F 1/13394 |
| | | | 349/106 |
| 2004/0114081 A1* | 6/2004 | Sawasaki | G02F 1/1368 |
| | | | 349/110 |
| 2004/0252271 A1* | 12/2004 | Song | G02F 1/13394 |
| | | | 349/155 |
| 2015/0131029 A1 | 5/2015 | Kaida et al. | |
| 2015/0185381 A1 | 7/2015 | Wu et al. | |
| 2017/0090245 A1 | 3/2017 | Tsuchiya et al. | |
| 2018/0081096 A1 | 3/2018 | Claes | |
| 2018/0156951 A1 | 6/2018 | Baek et al. | |
| 2019/0302524 A1 | 10/2019 | Chen | |
| 2020/0217998 A1 | 7/2020 | Jung et al. | |

FOREIGN PATENT DOCUMENTS

| | | |
|---|---|---|
| KR | 10-1550067 | 8/2015 |
| KR | 10-2018-0018945 | 2/2018 |
| KR | 10-2018-0064616 | 6/2018 |

OTHER PUBLICATIONS

Office Action dated Oct. 5, 2020 in corresponding U.S. Appl. No. 16/725,090.

* cited by examiner

OPTICAL FILTER AND DISPLAY DEVICE INCLUDING THE SAME

CROSS-REFERENCE TO RELATED APPLICATIONS

This application is a continuation of U.S. patent application Ser. No. 16/725,090 filed Dec. 23, 2019, which claims priority under 35 U.S.C. § 119 to Korean Patent Application No. 10-2019-0002406, filed on Jan. 8, 2019 in the Korean Intellectual Property Office, the disclosures of which is incorporated by reference herein in their entirety.

TECHNICAL FIELD

Exemplary embodiments of the present inventive concept relate to an optical filter and a display device including the same.

DISCUSSION OF THE RELATED ART

In accordance with advancements in various types of electronic apparatuses such as, for example, a cellular phone, a personal digital assistant (PDA), a computer, a large TV, etc., various types of display devices that may be applied to the electronic apparatuses are being developed. For example, display devices widely used in the market include a liquid-crystal display device including a backlight unit, an organic light-emitting display device emitting light of different colors in each pixel area, etc. Currently, a display device including a quantum dot-color conversion layer (QD-CCL) is being developed. Quantum dots are excited by incident light to thereby emit light having a longer wavelength than that of the incident light. Light in a low-wavelength band may be primarily used as the incident light.

SUMMARY

Color reproducibility and light-emitting efficiency of a display device including a quantum dot-color conversion layer (QD-CCL) may be improved by improving light conversion efficiency of quantum dots. Exemplary embodiments of the present inventive concept include an optical filter configured to increase utilization of incident light, by decreasing incident light that may not excite quantum dots (e.g., as a result of being filtered out), and a display device including the optical filter. However, exemplary embodiments of the present inventive concept are not limited thereto.

According to an exemplary embodiment, an optical filter includes a substrate including a plurality of pixel areas spaced apart from each other and a light-blocking area arranged between the plurality of pixel areas, a plurality of color filters arranged on a first surface of the substrate and corresponding to the plurality of pixel areas, and a plurality of conversion layers arranged on the first surface of the substrate and corresponding to the plurality of color filters. Each of the conversion layers includes at least one inclined side surface. The optical filter further includes a reflective layer arranged on the at least one inclined side surface of each of the plurality of conversion layers. The reflective layer extends to the light-blocking area and is arranged consecutively on two adjacent inclined side surfaces from among the inclined side surfaces of the plurality of conversion layers and the light-blocking area between the two adjacent inclined side surfaces.

In an exemplary embodiment, a horizontal cross-sectional area of at least one of the plurality of conversion layers decreases in a direction away from the substrate.

In an exemplary embodiment, the color filters are spaced apart from each other, and the reflective layer extends to a portion between two neighboring color filters from among the plurality of color filters.

In an exemplary embodiment, the reflective layer is arranged between side surfaces of the two neighboring color filters.

In an exemplary embodiment, the plurality of color filters extends to the light-blocking area such that side surfaces of the plurality of color filters are in contact with each other.

In an exemplary embodiment, the plurality of color filters includes a first color filter, a second color filter, and a third color filter. Each of the color filters transmits light of a different color. The first color filter, the second color filter, and the third color filter overlap each other in the light-blocking area to form a partition wall.

In an exemplary embodiment, the partition wall includes an inclined surface, and the plurality of conversion layers is arranged in concave portions defined by the partition wall.

In an exemplary embodiment, the reflective layer covers an upper surface of the partition wall.

In an exemplary embodiment, the optical filter further includes a planarization layer providing a flat surface by covering the plurality of conversion layers.

In an exemplary embodiment, the plurality of conversion layers includes a first conversion layer, a second conversion layer, and a third conversion layer. Each of the conversion layers includes scattering particles. The first conversion layer further includes first quantum dots, and the second conversion layer further includes second quantum dots. The first quantum dots and the second quantum dots include a same material and have different sizes.

According to an exemplary embodiment, a display device includes a light-emitting panel configured to emit incident light of a single color, and an optical filter configured to convert the incident light into light of different colors. The optical filter includes a substrate including a plurality of pixel areas spaced apart from each other and a light-blocking area arranged between the plurality of pixel areas, and a plurality of color filters arranged on a first surface of the substrate and corresponding to the plurality of pixel areas, in which the first surface of the substrate faces the light-emitting panel. The optical filter further includes a plurality of conversion layers arranged on the first surface of the substrate and corresponding to the plurality of color filters, in which the incident light is incident on the plurality of conversion layers, and a reflective layer arranged on side surfaces of the plurality of conversion layers. The reflective layer extends to the light-blocking area and is arranged integrally on the side surfaces of the plurality of conversion layers and in the light-blocking area between the plurality of conversion layers.

In an exemplary embodiment, the light-emitting panel includes a plurality of light-emitting devices configured to generate the incident light of a single color. The light-emitting devices are arranged to correspond to the plurality of pixel areas.

In an exemplary embodiment, the light-emitting panel includes a liquid-crystal layer including a plurality of liquid-crystal molecules, and the optical filter further includes a planarization layer providing a flat surface by covering the plurality of conversion layers. The display device further includes a polarization layer arranged between the light-emitting panel and the planarization layer.

In an exemplary embodiment, each of the plurality of conversion layers includes an inclined side surface, and horizontal cross-sectional areas of the plurality of conversion layers decrease in a direction away from the substrate.

In an exemplary embodiment, the color filters are spaced apart from each other, and the reflective layer is arranged between side surfaces of two neighboring color filters from among the plurality of color filters in the light-blocking area.

In an exemplary embodiment, the plurality of color filters includes a first color filter, a second color filter, and a third color filter. Each of the color filters transmits light of a different color. The first color filter, the second color filter, and the third color filter overlap each other in the light-blocking area to form a partition wall. The plurality of conversion layers is arranged in a concave portion defined by the partition wall.

In an exemplary embodiment, the reflective layer covers an upper surface of the partition wall, and the upper surface of the partition wall faces the light-emitting panel.

In an exemplary embodiment, the plurality of conversion layers includes a first conversion layer, a second conversion layer, and a third conversion layer. Each of the conversion layers includes scattering particles. The first conversion layer further includes first quantum dots, and the second conversion layer further includes second quantum dots. The first quantum dots and the second quantum dots include a same material and have different sizes.

In an exemplary embodiment, colors of light that passes through the first conversion layer, the second conversion layer, and the third conversion layer are different from each other, and the color of the light that passes through the third conversion layer is identical to a color of the incident light.

In an exemplary embodiment, the display device further includes a low refractive index layer arranged between the plurality of color filters and the plurality of conversion layers, and having a refractive index equal to or less than about 1.2.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
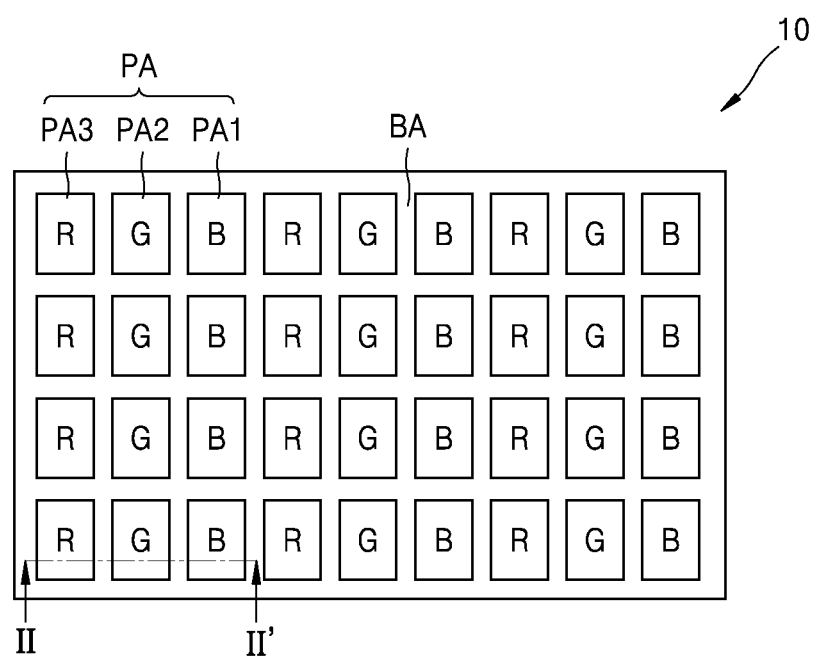
FIG. 1 is a schematic plan view illustrating an example of a display device according to an exemplary embodiment.

Exemplary embodiments of the present inventive concept will be described more fully hereinafter with reference to the accompanying drawings. Like reference numerals may refer to like elements throughout the accompanying drawings. Expressions such as "at least one of", when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another. Thus, a "first" component in an exemplary embodiment may be described as a "second" component in another exemplary embodiment.

As used herein, the singular forms "a", "an" and "the" are intended to include the plural forms as well, unless the context clearly indicates otherwise.

It will be understood that when a layer, region, or component is referred to as being "formed on" another layer, region, or component, it can be directly or indirectly formed on the other layer, region, or component. That is, for example, intervening layers, regions, or components may or may not be present.

When a certain exemplary embodiment may be implemented differently, a specific process order may be performed differently from the described order. For example, two consecutively described processes may be performed substantially at the same time or performed in an order opposite to the described order.

Figure 2:
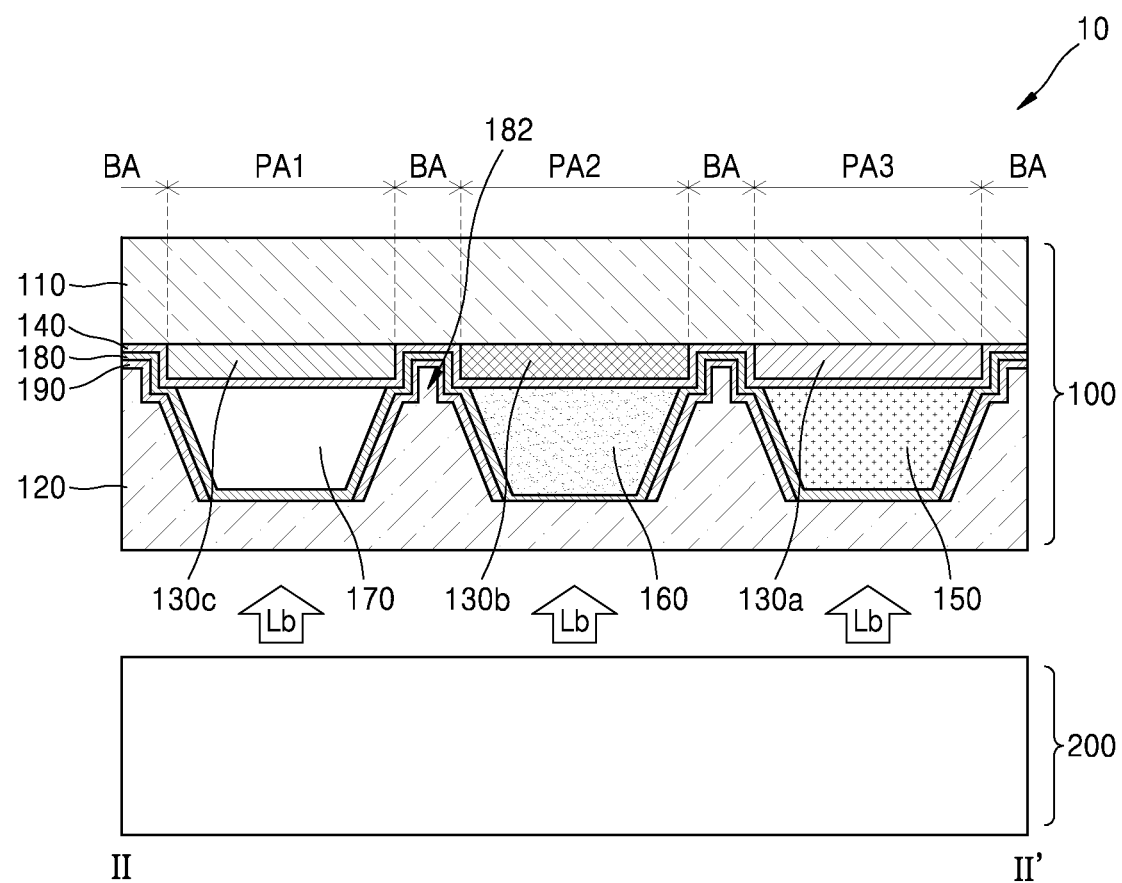
FIG. 2 is a schematic cross-sectional view taken along line II-IP of FIG. 1 according to an exemplary embodiment.
Figure 3:
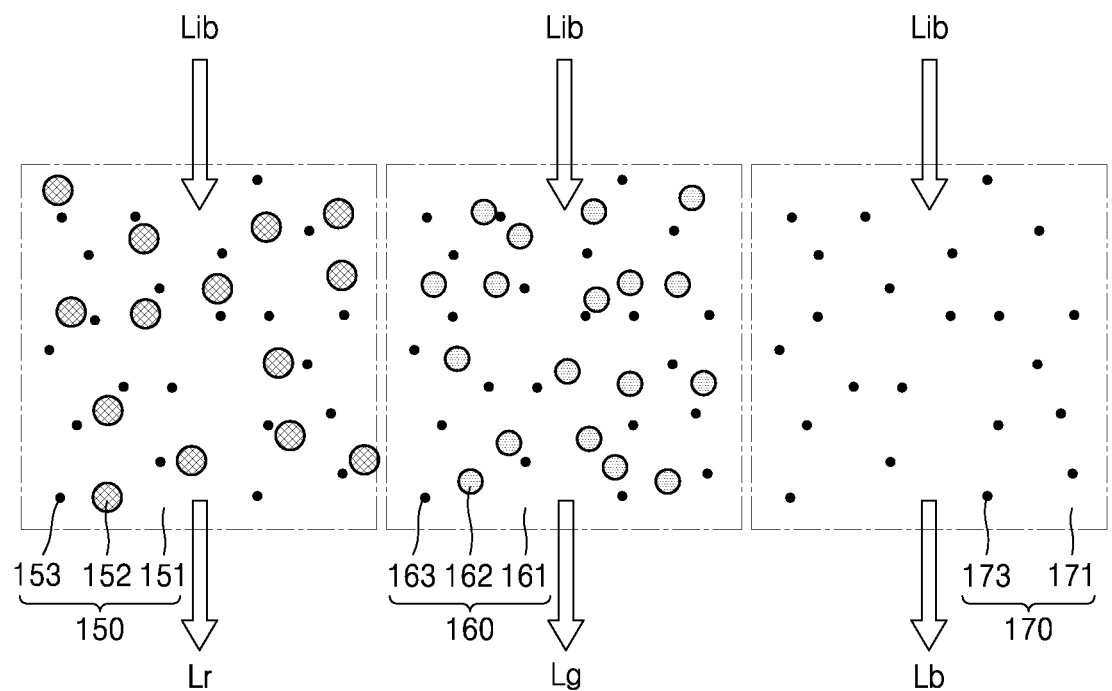
FIG. 3 is an enlarged cross-sectional view of first to third conversion layers of FIG. 2.

FIG. 1 is a schematic plan view illustrating an example of a display device 10 according to an exemplary embodiment. FIG. 2 is a schematic cross-sectional view taken along line II-II' of FIG. 1 according to an exemplary embodiment. FIG. 3 is an enlarged cross-sectional view of first to third conversion layers 150, 160, and 170 of FIG. 2.

Referring to FIGS. 1 to 3, according to an exemplary embodiment, the display device 10 may include an optical filter 100 and a light-emitting panel 200.

The optical filter 100 may receive incident light Lib generated from the light-emitting panel 200, and emit light of first to third colors. In an exemplary embodiment, the incident light Lib incident from the light-emitting panel 200 on the optical filter 100 may be light of a single color, and light of the first to third colors emitted from the optical filter 100 may be red light, green light, and blue light, respectively. The optical filter 100 may be directly adhered to the light-emitting panel 200 by, for example, an adhesive layer. In an exemplary embodiment, an insulating layer or a filling layer may be further included between the optical filter 100 and the light-emitting panel 200. The insulating layer may include a transparent material having transmissibility, and the filling layer may include an air layer.

The optical filter 100 may include a substrate 110, first to third color filters 130a, 130b, and 130c arranged on a first surface of the substrate 110, first to third conversion layers 150, 160, and 170 arranged in correspondence with the first to third color filters 130a, 130b, and 130c, respectively, and a reflective layer 190 arranged at least on side surfaces of the first to third conversion layers 150, 160, and 170. The first surface of the substrate 110 refers to a surface facing the light-emitting panel 200.

The substrate 110 includes a pixel area PA and a light-blocking area BA. The pixel area PA is an area from which light is emitted and which is surrounded by the light-blocking area BA. The pixel area PA may be divided into a first pixel area PA1, a second pixel area PA2, and a third pixel area PA3, according to a color of the emitted light. The first pixel area PA1, the second pixel area PA2, and the third pixel area PA3 may be spaced apart from each other. The light-blocking area BA may be located between adjacent areas from among the first pixel area PA1, the second pixel area PA2, and the third pixel area PA3.

The light-blocking area BA is an area from which light is not emitted, and may surround the first to third pixel areas PA1, PA2, and PA3. As shown in FIG. 1, in an exemplary embodiment, the light-blocking area BA may have a mesh form. However, the arrangement of each of the pixel areas PA1, PA2, and PA3 shown in FIG. 1 is exemplary, and the present inventive concept is not limited thereto. For example, the first to third pixel areas PA1, PA2, and PA3 may be arranged in various forms other than the form illustrated in FIG. 1.

The substrate 110 may include a material having transmissibility such as, for example, an insulating material such as glass, plastic, crystal, etc. A material of the substrate 110 may be selected by taking into account, for example, a mechanical strength, thermal stability, transparency, surface smoothness, ease of handling, waterproofness, etc. In an exemplary embodiment, when the substrate 110 includes a polymer material, the substrate 110 may include, for example, polycarbonate (PC), polyethylene terephthalate (PET), polyethylene (PE), polypropylene (PP), polysulfone (PSF), polymethyl methacrylate (PMMA), cellulose triacetate (TAC), cyclo olefin polymer (COP), cyclic olefin copolymer (COC), etc.

The first to third color filters 130a, 130b, and 130c include a dye or a pigment to thereby transmit only a particular color. For example, the first color filter 130a may selectively transmit only light of a first color, the second color filter 130b may selectively transmit only light of a second color, and the third color filter 130c may selectively transmit only light of a third color. In an exemplary embodiment, light of the first color may be red light, light of the second color may be green light, and light of the third color may be blue light. The red light may be light having a peak wavelength equal to or greater than about 580 nm and less than about 750 nm. The green light may be light having a peak wavelength equal to or greater than about 495 nm and less than about 580 nm. The blue light may be light having a peak wavelength equal to or greater than about 400 nm and less than about 495 nm. The incident light Lib may be the light of the third color, that is, the blue light.

The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art.

The first color filter 130a may be arranged to correspond to at least the third pixel area PA3, the second color filter 130b may be arranged to correspond to at least the second pixel area PA2, and the third color filter 130c may be arranged to correspond to at least the first pixel area PAL For example, the first color filter 130a may be arranged in the third pixel area PA3 and not in the first and second pixel areas PA1 and PA2, the second color filter 130b may be arranged in the second pixel area PA2 and not in the first and third pixel areas PA1 and PA3, and the third color filter 130c may be arranged in the first pixel area PA1 and not in the second and third pixel areas PA2 and PA3.

The first to third conversion layers 150, 160, and 170 may be arranged on the first surface of the substrate 110 to correspond to the first, second, and third color filters 130a, 130b, and 130c, respectively. For example, the first conversion layer 150 may be arranged in the third pixel area PA3 with the first color filter 130a, the second conversion layer 160 may be arranged in the second pixel area PA2 with the second color filter 130b, and the third conversion layer 170 may be arranged in the first pixel area PA1 with the third color filter 130c. When the incident light Lib is generated from the light-emitting panel 200, the first to third conversion layers 150, 160, and 170 convert the incident light Lib generated from the light-emitting panel 200 into light having a particular color, and emit the light having the particular color toward the substrate 110.

In an exemplary embodiment, the first conversion layer 150 may convert the incident light Lib that is blue light into light Lr of the first color. The light Lr of the first color may be red light. To do so, the first conversion layer 150 may include a first photosensitive polymer 151 in which first quantum dots 152 are dispersed.

The first photosensitive polymer 151 may be an organic material having light transmissibility such as, for example, silicon resin, epoxy resin, etc.

The first quantum dots 152 may be excited by the blue incident light Lib to thereby isotropically emit the light Lr of the first color having a wavelength longer than that of the blue light. The first quantum dots 152 may include, for example, a Group II-VI compound, a Group III-V compound, a Group IV-VI compound, a Group IV compound, or a combination thereof.

First scattering particles 153 may be further dispersed in the first photosensitive polymer 151. The first scattering particles 153 may scatter part of the blue incident light Lib, that is, the part which was not absorbed into the first quantum dots 152, so that a greater number of the first quantum dots 152 are excited. As a result, a color conversion rate of the first conversion layer 150 may be increased. The first scattering particles 153 may include, for example, titanium dioxide ($TiO_2$), metal particles, etc.

The second conversion layer 160 converts the blue incident light Lib into light Lg of the second color. The light Lg of the second color may be green light. The second conversion layer 160 may include a second photosensitive polymer 161 in which second quantum dots 162 are dispersed. In the second photosensitive polymer 161, second scattering particles 163 may be dispersed with the second quantum dots 162. As a result, a color conversion rate of the second conversion layer 160 may be increased.

The second photosensitive polymer 161 may include a same material as that of the first photosensitive polymer 151. The second scattering particles 163 may include a same material as that of the first scattering particles 153. The second quantum dots 162 may include, for example, a Group II-VI compound, a Group III-V compound, a Group IV-VI compound, a Group IV compound, or a combination thereof. That is, the second quantum dots 162 may be a same material as that of the first quantum dots 152. However, a size of the second quantum dots 162 may be different than a size of the first quantum dots 152. For example, in an exemplary embodiment, a size of the second quantum dots 162 may be less than a size of the first quantum dots 152. Thus, the second quantum dots 162 may be excited by the blue incident light Lib to thereby isotropically emit the light Lg of the second color having a wavelength longer than that of the blue light but shorter than that of the light Lr of the first color.

The third conversion layer 170 may include a third photosensitive polymer 171 in which third scattering particles 173 are dispersed. That is, the third conversion layer 170 does not include a separate quantum dot that may be excited by the blue incident light Lib Like the first and second photosensitive polymers 151 and 161, the third photosensitive polymer 171 may include an organic material having light transmissibility. The third scattering particles 173 may include a same material as that of the first and second scattering particles 153 and 163. Accordingly, since the blue incident light Lib incident on the third conversion layer 170 may pass through the third conversion layer 170 without a color change, the light Lb of the third color emitted through the third conversion layer 170 may be blue light. However, the blue incident light Lib may be scattered by the third scattering particles 173 in the third conversion layer 170, and then, emitted toward the substrate 110.

The first to third conversion layers 150, 160, and 170 may be covered by a barrier layer 180. The barrier layer 180 may be arranged on the entire first surface of the substrate 110 to cover the first to third conversion layers 150, 160, and 170. For example, the barrier layer 180 may cover an entirety of each of the first to third conversion layers 150, 160, and 170. The barrier layer 180 includes an inorganic insulating material such as, for example, silicon nitride (SiNx) and/or silicon oxide (SiOx), and may prevent outgassing of the first to third conversion layers 150, 160, and 170.

Each of the first to third conversion layers 150, 160, and 170 may have at least one inclined side surface. The at least one inclined side surface may be inclined toward a center of the corresponding conversion layer in a cross-sectional view. In an exemplary embodiment, each side surface of each of the first to third conversion layers 150, 160, and 170 may be inclined. In addition, since the reflective layer 190 is arranged over the inclined surface of each of the first to third conversion layers 150, 160, and 170, conversion efficiency of the first quantum dots 152 and the second quantum dots 162 and light-emitting efficiency of the display device 10 may be improved.

The reflective layer 190 may be arranged directly on the barrier layer 180. The barrier layer 180 may include a metal material having excellent reflectivity such as, for example, silver (Ag), aluminum (Al), etc. The reflective layer 190 may have reflectivity equal to or greater than about 30%, for example, reflectivity equal to or greater than about 50% and less than about 100%. The reflective layer 190 may extend to the light blocking area BA, and may be disposed in the light blocking area BA. The reflective layer 190 reflects the incident light Lib, which did not excite the first quantum dots 152 or the second quantum dots 162, to thereby reduce the incident light Lib that did not excite the first quantum dots 152 or the second quantum dots 162 (e.g., the incident light Lib that is filtered out). Thus, utilization of the incident light Lib may be improved (e.g., less incident light Lib is wasted). Accordingly, the conversion efficiency of the first quantum dots 152 and the second quantum dots 162 may be improved.

In addition, as shown in FIG. 2, the inclined side surface of each of the first to third conversion layers 150, 160, and 170 may be configured so that horizontal cross-sectional areas of the first to third conversion layers 150, 160, and 170 decrease in a direction away from the substrate 110. For example, the horizontal cross-sectional area of each of the first to third conversion layers 150, 160, and 170 may decrease as the distance from the substrate 110 increases. Thus, when light emitted from the first quantum dots 152 and the second quantum dots 162 and light scattered by the third scattering particles 173 are reflected by the reflective layer 190, the reflected light may proceed toward the substrate 110. Accordingly, light-emitting efficiency of the display device 10 may be improved. For example, an inclination angle of the inclined side surface of each of the first to third conversion layers 150, 160, and 170 may be about 30° to about 85°.

The reflective layer 190 may extend to the light-blocking area BA. For example, a portion of the reflective layer 190 may be disposed in the first to third pixel areas PA1, PA2, and PA3, and the reflective layer 190 may extend therefrom into the light-blocking area BA. The reflective layer 190 arranged in the light-blocking area BA may prevent light from being emitted to the outside through the light-blocking area BA and leaking from the display device 10. The reflective layer 190 may be arranged consecutively to correspond to two adjacent side surfaces among side surfaces of the first to third color filters 130a, 130b, and 130c, in which the light-blocking area BA is arranged between the two adjacent side surfaces. That is, the reflective layer 190 may be arranged integrally over the side surfaces of the first to third color filters 130a, 130b, and 130c and in the light-blocking area BA. For example, the reflective layer 190 may be arranged in the light-blocking area BA on two adjacent inclined side surfaces among inclined side surfaces of the first to third color filters 130a, 130b, and 130c, and may extend continuously (e.g., without any breaks or openings) across the two adjacent inclined side surfaces and the corresponding light-blocking area BA in which the reflective layer 190 is arranged. In exemplary embodiments, the reflective layer 190 is not arranged on bottom surfaces of the first to third color filters 130a, 130b, and 130c. Thus, according to exemplary embodiments of the present inventive concept, since a separate light-blocking member is not needed to prevent light leakage, a structure of the optical filter 100 may be simplified.

As shown in FIG. 3, the first to third color filters 130a, 130b, and 130c may be spaced apart from each other, and the reflective layer 190 may extend to neighboring portions between the first to third color filters 130a, 130b, and 130c. For example, in an exemplary embodiment, a concave portion 182 is located between the second color filter 130b and the third color filter 130c adjacent to each other. Since the reflective layer 190 is arranged in the concave portion 182, the reflective layer 190 is arranged between a side surface of the second color filter 130b and a side surface of the third color filter 130c facing each other. Accordingly, when light is emitted via the second color filter 130b and the third color filter 130c, mixing of colors of the light may be prevented or reduced. Thus, a color matching rate and color reproducibility of the display device 10 may be improved.

A low refractive index layer 140 may be further arranged between the first to third color filters 130a, 130b, and 130c and the first to third conversion layers 150, 160, and 170. The low refractive index layer 140 may include an inorganic material or an organic material. That is, the low refractive index layer 140 may be arranged over the first surface of the substrate 110, on which the first to third color filters 130a, 130b, and 130c are arranged, and may cover the first to third color filters 130a, 130b, and 130c.

The low refractive index layer 140 may improve light-emitting efficiency of light having passed through the first to third conversion layers 150, 160, and 170. A refractive index of the low refractive index layer 140 may be less than that of the first to third conversion layers 150, 160, and 170 and that of the first to third color filters 130a, 130b, and 130c. Thus, light-emitting efficiency of the light that passed through the first to third conversion layers 150, 160, and 170 may be improved. For example, the first to third conversion layers 150, 160, and 170 and the first to third color filters 130a, 130b, and 130c may have, for example, a refractive index equal to or greater than about 1.4, for example, a refractive index of about 1.4 to about 1.7. In this case, a refractive index of the low refractive index layer 140 may be less than about 1.4, for example, equal to or less than about 1.2.

Since the first to third conversion layers 150, 160, and 170 are spaced apart from each other, the low refractive index layer 140 may be directly in contact with the barrier layer 180 in the light-blocking area BA. That is, the first to third conversion layers 150, 160, and 170 may each have a form capsulized by the low refractive index layer 140 and the barrier layer 180. For example, each of the first to third conversion layers 150, 160, and 170 may have boundaries defined by the low refractive index layer 140 and the barrier layer 180. For example, each of the first to third conversion layers 150, 160, and 170 may have an upper boundary defined by the low-refractive index layer 140, and side boundaries and a lower boundary defined by the barrier layer 180.

The optical filter 100 may further include a planarization layer 120 covering the first to third conversion layers 150, 160, and 170, thereby providing a flat surface onto surfaces of the first to third conversion layers 150, 160, and 170 facing the light-emitting panel 200. The planarization layer 120 may include a transparent organic material such as, for example, polyimide resin, acrylic resin, a resist material, etc. The planarization layer 120 may be formed by using a wet process such as a slit-coating method, a spin coating method, etc., a dry process such as a chemical vapor deposition method, a vacuum deposition method, etc. or the like.

Figure 4:
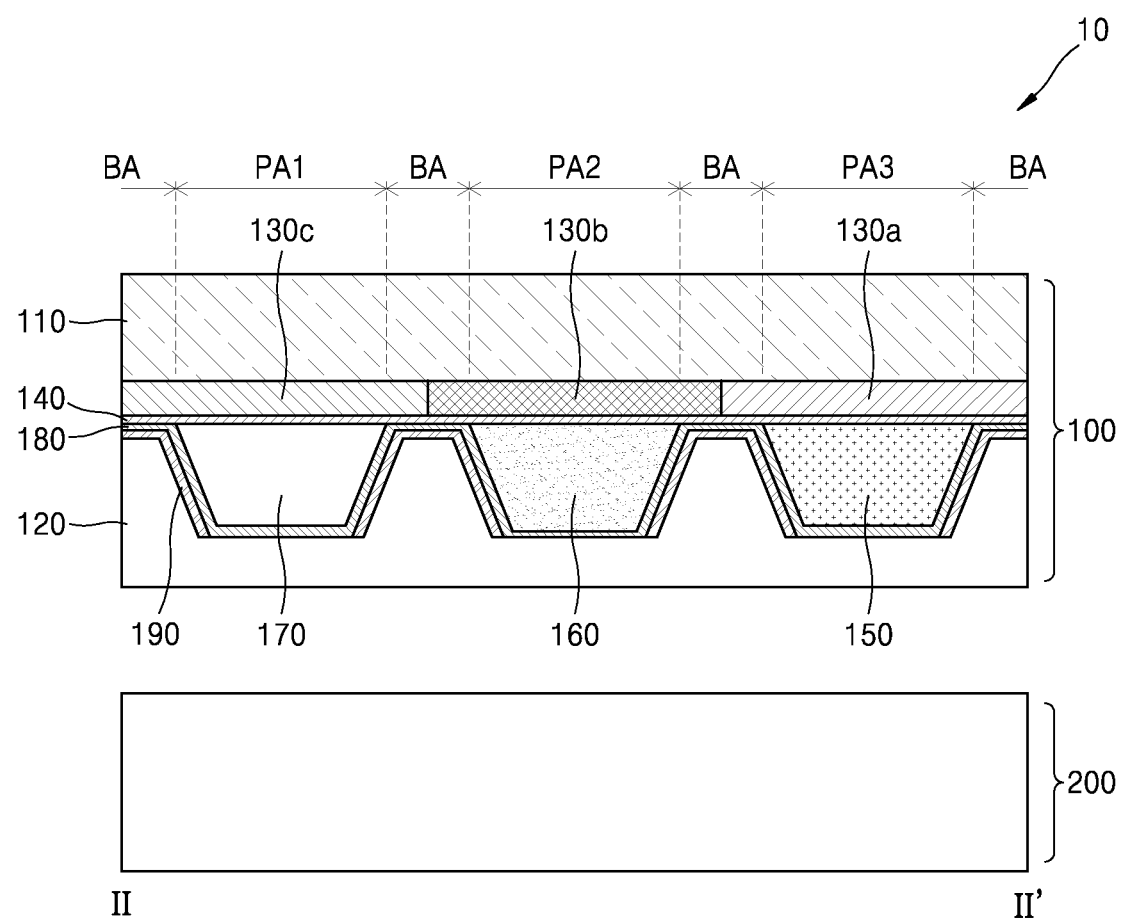
FIG. 4 is a schematic cross-sectional view taken along line II-IP of FIG. 1 according to an exemplary embodiment.

FIG. 4 is a schematic cross-sectional view taken along line II-IP of FIG. 1 according to an exemplary embodiment. For convenience of explanation, a further description of elements and technical aspects previously described may be omitted.

Referring to FIG. 4, the display device 10 may include the light-emitting panel 200 configured to emit the blue incident light Lib, and the optical filter 100 configured to receive the incident light Lib and emit light of first to third colors.

The optical filter 100 may include the substrate 110 including the first to third pixel areas PA1, PA2, and PA3 and the light-blocking area BA, the first to third color filters 130a, 130b, and 130c arranged on a first surface of the substrate 110, the first to third conversion layers 150, 160, and 170 arranged to correspond to the first to third color filters 130a, 130b, and 130c, respectively, and the reflective layer 190 arranged at least on side surfaces of the first to third conversion layers 150, 160, and 170. The first surface of the substrate 110 refers to a surface facing the light-emitting panel 200.

In addition, the low refractive index layer 140 may be further arranged between the first to third color filters 130a, 130b, and 130c and the first to third conversion layers 150, 160, and 170. The first to third conversion layers 150, 160, and 170 may be covered by the barrier layer 180, and the planarization layer 120 covers the first to third conversion layers 150, 160, and 170, thereby providing a flat surface to the optical filter 100, as described with reference to FIGS. 1 to 3.

Referring to FIG. 4, the first to third color filters 130a, 130b, and 130c extend to the light-blocking area BA between adjacent areas from the first to third pixel areas PA1, PA2, and PA3, such that side surfaces of the first to third color filters 130a, 130b, and 130c adjacent to each other are in contact with each other. For example, side surfaces of the first to third color filters 130a, 130b, and 130c adjacent to each other may directly contact each other. Since sizes of the first to third color filters 130a, 130b, and 130c are greater than those of the first to third pixel areas PA1, PA2, and PA3, even when an error occurs in a position in which the first to third color filters 130a, 130b, and 130c are arranged, a defect does not occur in the optical filter 100. Thus, manufacture efficiency of the optical filter 100 may be improved.

In addition, thicknesses of the first to third color filters 130a, 130b, and 130c may be identical to each other. In this case, the side surfaces of the first to third color filters 130a, 130b, and 130c may be in contact with each other to thereby constitute a substantially flat surface. Herein, when a surface is referred to as being substantially flat, it is to be understood that the surface is exactly flat, or if not exactly flat, is approximately flat within a measurement error as would be understood by a person having ordinary skill in the art. Since the surface formed by the first to third color filters 130a, 130b, and 130c is substantially flat, a subsequent process in which the low refractive index layer 140, the barrier layer 180, and the reflective layer 190 are formed over the first to third color filters 130a, 130b, and 130c may be efficiently performed.

Each of the first to third conversion layers 150, 160, and 170 may have an inclined side surface, and the reflective layer 190 is arranged over the inclined surfaces of each of the first to third conversion layers 150, 160, and 170. For example, each of the first to third conversion layers 150, 160, and 170 may have a side surface inclined toward a center of the corresponding conversion layer. Thus, conversion efficiency of the first quantum dots 152 and the second quantum dots 162 (see FIG. 3) and light-emitting efficiency of the display device 10 may be improved. In addition, since the reflective layer 190 is extended to the light-blocking area BA, the reflective layer 190 may prevent light from being emitted to outside (e.g., outside of the display device 10) through the light-blocking area BA. Thus, light leaking from the display device 10 may be prevented or reduced. Accordingly, according to exemplary embodiments of the present inventive concept, since a separate light-blocking member is not needed to prevent light leakage, a structure of the optical filter 100 may be simplified.

Figure 5:
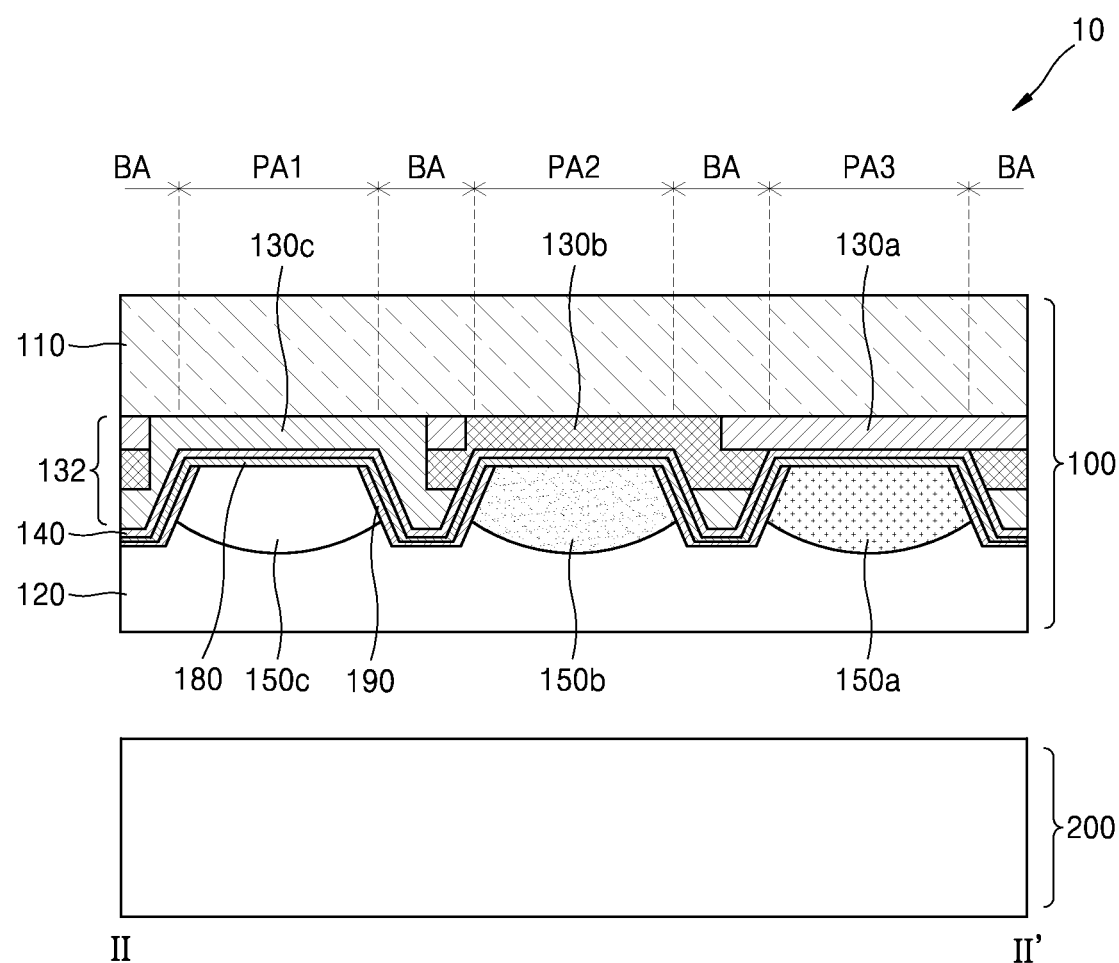
FIG. 5 is a schematic cross-sectional view taken along line II-IP of FIG. 1 according to an exemplary embodiment.

FIG. 5 is a schematic cross-sectional view taken along line II-IP of FIG. 1 according to an exemplary embodiment. For convenience of explanation, a further description of elements and technical aspects previously described may be omitted.

Referring to FIG. 5, the display device 10 may include the optical filter 100 and the light-emitting panel 200.

The optical filter 100 may include the substrate 110 including the first to third pixel areas PA1, PA2, and PA3 and the light-blocking area BA, the first to third color filters 130a, 130b, and 130c arranged on a first surface of the substrate 110, first to third conversion layers 150a, 150b, and 150c arranged to correspond to the first to third color filters 130a, 130b, and 130c, respectively, and the reflective layer 190 arranged at least on side surfaces of the first to third conversion layers 150a, 150b, and 150c. The first surface of the substrate 110 refers to a surface facing the light-emitting panel 200.

The first to third color filters 130a, 130b, and 130c may overlap with each other in the light-blocking area BA. The first to third color filters 130a, 130b, and 130c may each transmit light of a particular color, for example, only red light, only green light, or only blue light, respectively. When the first to third color filters 130a, 130b, and 130c are stacked, the stacked first to third color filters 130a, 130b, and 130c may function as a black matrix that obstructs light. Accordingly, when the first to third color filters 130a, 130b, and 130c overlap with each other in the light-blocking area BA, light may be prevented from being emitted to the outside (e.g., outside of the display device 10) through the light-blocking area BA. Thus, light leaking from the display device 10 may be prevented or reduced.

In addition, the first to third color filters 130a, 130b, and 130c overlapping in the light-blocking area BA constitute a partition wall 132 defining an area in which the first to third conversion layers 150a, 150b, and 150c are arranged. The first to third conversion layers 150a, 150b, and 150c may be formed in a concave portion, defined by the partition wall 132, by using an inkjet method. Even though a method of forming the first to third conversion layers 150a, 150b, and 150c is different from that of the first to third conversion layers 150, 160, and 170 described with reference to FIG. 2, a function of the first to third conversion layers 150a, 150b, and 150c may be the same as that of the first to third conversion layers 150, 160, and 170. Accordingly, the first to third conversion layers 150a, 150b, and 150c may convert light incident from the light-emitting panel 200 into light of a particular color, and emit the light of the particular color toward the substrate 110.

In such a case that the partition wall 132 is constituted when the first to third color filters 130a, 130b, and 130c overlap each other in the light-blocking area BA, the partition wall 132 has an inclination surface, and the reflective layer 190 may be arranged on the inclined surface of the partition wall 132. For example, when a horizontal cross-sectional area of the partition wall 132 becomes further away from the substrate 110, the inclined surface of the partition wall 132 may decrease. In this case, the reflective layer 190 may be arranged on a first surface of the partition wall 132 to thereby cover the light-blocking area BA. Here, the first surface of the partition wall 132 is a surface facing the light-emitting panel 200 that is a display panel, and may be referred to as an upper surface of the partition wall 132. In such a case that the reflective layer 190 is arranged on the first surface of the partition wall 132, when light generated from the light-emitting panel 200 proceeds toward the partition wall 312, the light is reflected by the reflective layer 190 and directed toward the light-emitting panel 200. The light reflected toward the light-emitting panel 200 may be re-reflected by the light-emitting panel 200, for example, by an opposite electrode 235 (shown in FIG. 6), and be re-incident onto the optical filter 100. Thus, utilization of incident light may be improved.

As described above, when the partition wall 132 has the inclined surface, the first to third conversion layers 150a, 150b, and 150c, each in the concave portion between partition walls 132, may have inclined surfaces. As a result, the reflective layer 190 is arranged on the inclined surfaces of the first to third conversion layers 150a, 150b, and 150c. When light generated from the light-emitting panel 200 is reflected by the reflective layer 190, the reflective layer 190 may direct light toward central portions of the first to third conversion layers 150a, 150b, and 150c. Thus, utilization of incident light may be improved, and light conversion efficiency of the optical filter 100 may be improved.

The planarization layer 120 may be arranged over the partition wall 132 and the first to third conversion layers 150a, 150b, and 150c. The planarization layer 120 may cover the partition wall 132 and the first to third conversion layers 150a, 150b, and 150c, thereby providing a substantially flat surface.

The low refractive index layer 140 may be arranged on the first to third color filters 130a, 130b, and 130c. The low refractive index layer 140 may improve light-emitting efficiency of light having passed through the first to third conversion layers 150a, 150b, and 150c. In addition, the barrier layer 180 may be arranged on the low refractive index layer 140. The barrier layer 180 may prevent outgassing of the first to third color filters 130a, 130b, and 130c. The barrier layer 180 may include an inorganic material. For example, the barrier layer 180 may include an inorganic insulating material such as silicon nitride (SiNx) and/or silicon oxide (SiOx). Alternately, the barrier layer 180 may include an organic insulating material, or an inorganic insulating layer and an organic insulating layer.

Figure 6:
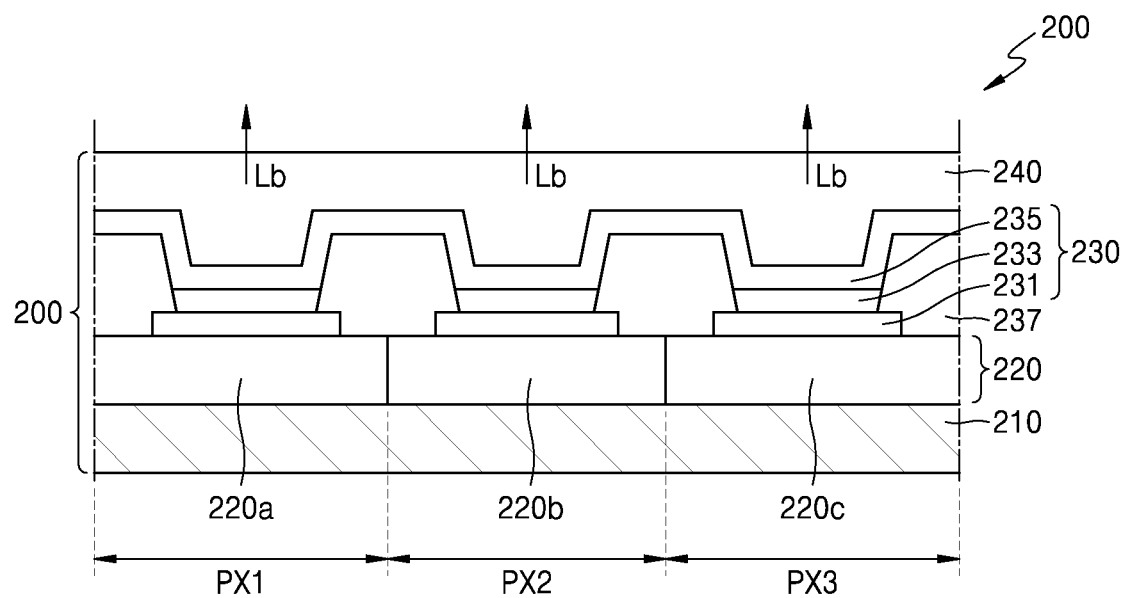
FIG. 6 is a schematic cross-sectional view illustrating a light-emitting panel in the display device of FIG. 1 according to an exemplary embodiment.
Figure 7:
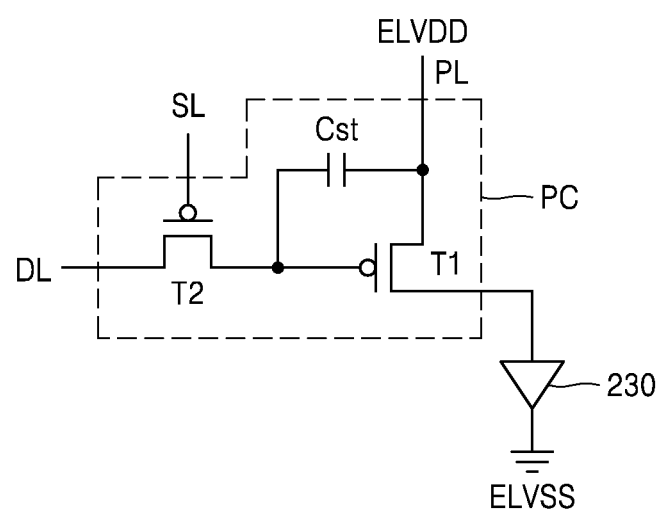
FIG. 7 is an equivalent circuit diagram of a pixel of the light-emitting panel of FIG. 6.

FIG. 6 is a schematic cross-sectional view illustrating a light-emitting panel 200 in the display device 10 of FIG. 1 according to an exemplary embodiment. FIG. 7 is an equivalent circuit diagram of a pixel of the light-emitting panel 200 of FIG. 6.

Referring to FIGS. 6 and 7, the light-emitting panel 200 may include first to third pixels PX1, PX2, and PX3. The first pixel PX1 includes a light-emitting device 230 and a first pixel circuit 220a configured to control the light-emitting device 230. The second pixel PX2 includes the light-emitting device 230 and a second pixel circuit 220b configured to control the light-emitting device 230. The third pixel PX3 includes the light-emitting device 230 and a third pixel circuit 220c configured to control the light-emitting device 230.

The light-emitting device 230 may emit light of a third color, for example, the blue light Lb, in which an amount of the emitted light is controlled by each of the first to third pixel circuits 220a, 220b, and 220c. The light-emitting device 230 is arranged to correspond to the pixel area PA (shown in FIG. 1) of the optical filter 100 (shown in FIG. 2). The blue light Lb emitted from the light-emitting device 230 is the incident light Lib (shown in FIG. 2) incident on the optical filter 100 (shown in FIG. 2).

For example, when an amount of the light Lb of the third color is controlled by the first pixel circuit 220a of the first pixel PX1 and the light Lb of the third color is emitted from the light-emitting device 230, the light Lb of the third color is converted into light of a first color via the first conversion layer 150 (shown in FIG. 2) and the light of the first color is emitted to the outside via the substrate 110 (shown in FIG. 2). When an amount of the light Lb of the third color is controlled by the second pixel circuit 220b of the second pixel PX2 and the light Lb of the third color is emitted from the light-emitting device 230, the light Lb of the third color is converted into light of a second color via the second conversion layer 160 (shown in FIG. 2) and the light of the second color is emitted to the outside via the substrate 110 (shown in FIG. 2). In addition, when an amount of the light Lb of the third color is controlled by the third pixel circuit 220c of the third pixel PX3 and the light Lb of the third color is emitted from the light-emitting device 230, the light Lb of the third color is emitted to the outside via the substrate 110 (shown in FIG. 2) without any color conversion via the third conversion layer 170. Accordingly, because the blue light Lb emitted from the light-emitting panel 200 is incident on the optical filter (shown in FIG. 2) and converted into red light, green light, and blue light, a color image is displayed as an image of the blue light Lb.

Each of the first to third pixel circuits 220a, 220b, and 220c is arranged in a pixel circuit layer 220 below the light-emitting device 230. In an exemplary embodiment, each of the first to third pixel circuits 220a, 220b, and 220c may at least partially overlap the light-emitting device 230. In an exemplary embodiment, each of the first to third pixel circuits 220a, 220b, and 220c or does not overlap the light-emitting device 230.

As shown in FIG. 7, each of the first to third pixel circuits 220a, 220b, and 220c may include first and second thin-film transistors T1 and T2, a storage capacitor Cst, and wires electrically connected to the first and second thin-film transistors T1 and T2 and the storage capacitor Cst. However, it is to be understood that the configuration shown in FIG. 7 is exemplary, and the first to third pixel circuits 220a, 220b, and 220c may have various configurations different than the configuration shown in FIG. 7. FIG. 7 may correspond to any of the first to third pixel circuits 220a, 220b, and 220c. In FIG. 7, the pixel circuit is denoted by PC.

The second thin-film transistor T2 is a switching thin-film transistor, and connected to a scan line SL and a data line DL. According to a switching voltage input from the scan line SL, the second thin-film transistor T2 may transmit a data voltage to the first thin-film transistor T1 when the data voltage is input from the data line DL. The storage capacitor Cst is connected to the second thin-film transistor T2 and a driving voltage line PL. The storage capacitor Cst may store a voltage corresponding to a difference between a voltage transmitted from the second thin-film transistor T2 and a first power voltage ELVDD supplied to the driving voltage PL. The first thin-film transistor T1 is a driving thin-film transistor, and connected to the driving voltage line PL and the storage capacitor Cst. The first thin-film transistor T1 may control a driving current flowing from the driving voltage line PL to the light-emitting device 230 in correspondence with a value of the voltage stored in the storage capacitor Cst.

The light-emitting device 230 may emit light having a certain brightness according to the driving current. The light-emitting device 230 may include a pixel electrode 231, an intermediate layer 233, and an opposite electrode 235. The opposite electrode 235 of the light-emitting device 230 may receive a second power voltage ELVSS. As an example, the light-emitting device 230 may be an organic light-emitting diode. However, the light-emitting device 230 is not limited thereto.

The pixel electrode 231 may be electrically connected to a source electrode or a drain electrode of a thin-film transistor. The pixel electrode 231 is exposed through an opening of a pixel-defining layer 237, and edges of the pixel electrode 231 may be covered by the pixel-defining layer 237.

The intermediate layer 233 may be arranged on the pixel electrode 231 exposed through the pixel-defining layer 237. The intermediate layer 233 may include an organic emissive layer. The organic emissive layer may be, for example, a low-molecular weight organic material or a polymer organic material. The intermediate layer 233 may selectively further include functional layers such as, for example, a hole transport layer (HTL), a hole injection layer (HIL), an electron transport layer (ETL), an electron injection layer (EIL), etc., in addition to the organic emissive layer.

The opposite electrode 235 may be arranged to cover the intermediate layer 233 and the pixel-defining layer 237. The opposite electrode 235 may be, for example, a transparent or translucent electrode. For example, the opposite electrode 235 may include a metal thin film having a low work function. The opposite electrode 235 may include a transparent conductive layer including, for example, transparent conductive oxide (TCO).

An encapsulation layer 240 may be arranged on the light-emitting device 230. The encapsulation layer 240 may cover the opposite electrode 235 and be arranged over a whole surface of a base substrate 210. The encapsulation layer 240 may include an inorganic encapsulation layer including at least one inorganic material, and an organic encapsulation layer including at least one organic material. In an exemplary embodiment, the encapsulation layer 240 may have a structure in which a first inorganic encapsulation layer, an organic encapsulation layer, and a second inorganic encapsulation layer are stacked.

Figure 8:
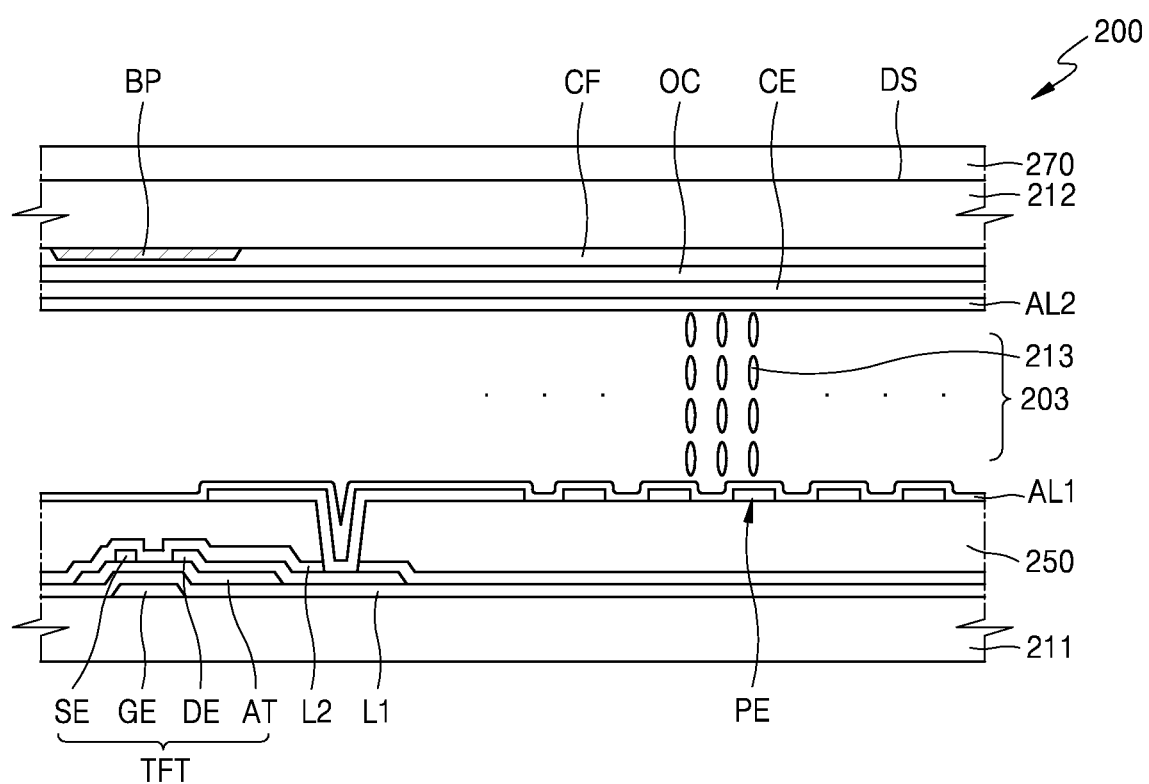
FIG. 8 is a schematic cross-sectional view illustrating a light-emitting panel in the display device of FIG. 1 according to an exemplary embodiment.

FIG. 8 is a schematic cross-sectional view illustrating the light-emitting panel 200 in the display device of FIG. 1 according to an exemplary embodiment.

As described above with reference to FIG. 7, light generated from the light-emitting panel 200 of FIG. 8 is blue light incident onto the optical filter 100 of FIG. 2.

Referring to FIG. 8, the light-emitting panel 200 may include a first substrate 211, a liquid-crystal layer 203 arranged over the first substrate 211 and including a plurality of liquid-crystal molecules 213, and a pixel electrode PE and a common electrode CE, each applying an electric field to the liquid-crystal layer 203. In addition, the light-emitting panel 200 may include a second substrate 212 facing the first substrate 211.

A thin-film transistor (TFT) array layer, the pixel electrode PE, and a first alignment layer AL1 may be arranged over the first substrate 211.

The first substrate 211 may be a glass substrate, or a plastic substrate including, for example, PET, polyethylene naphthalate (PEN), polyimide, etc.

The TFT array layer includes a switching device TFT, and includes a plurality of gate lines and a plurality of data lines. The switching device TFT is a thin-film transistor, and includes an active layer AT, a gate electrode GE, a source electrode SE, and a drain electrode DE.

A first insulating layer L1, which is a gate insulating layer, is arranged on the gate electrode GE. The active layer AT is arranged on the first insulating layer L1. The source electrode SE and the drain electrode DE are arranged on the active layer AT. The source electrode SE and the drain electrode DE are spaced apart from each other. A second insulating layer L2 is arranged to cover the source electrode SE and the drain electrode DE. In FIG. 8, a bottom-gate type thin-film transistor in which the gate electrode GE is arranged below the active layer AT is shown as an example. However, the present inventive concept is not limited thereto. For example, various types of thin-film transistors such as a top-gate type thin-film transistor, in which the gate electrode GE is arranged over the active layer AT, may be employed.

The active layer AT may include various materials. For example, in an exemplary embodiment, the active layer AT may include an inorganic semiconductor material such as amorphous silicon or crystalline silicon. In an exemplary embodiment, the active layer AT may include an oxide semiconductor. In an exemplary embodiment, the active layer AT may include an organic semiconductor material.

The gate electrode GE, the source electrode SE, and the drain electrode DE may include a single layer or multiple layers including at least one material selected from, for example, Al, platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

The first insulating layer L1 and the second insulating layer L2 may include various types of insulating materials.

Each of the first insulating layer L1 and the second insulating layer L2 may include a single-layered structure or a multi-layered structure including one or more insulating layers, each of the insulating layers including a material selected from, for example, silicon dioxide ($SiO_2$), silicon nitride (SiNx), silicon oxynitride (SiON), aluminum oxide ($Al_2O_3$), titanium dioxide ($TiO_2$), tantalum pentoxide ($Ta_2O_5$), hafnium oxide ($HfO_2$), zirconia $ZrO_2$), barium-strontium-titanate (BST), and lead zirconate titanate (PZT).

A planarization layer 250 may be further arranged above the TFT array layer. The pixel electrode PE is arranged on the planarization layer 250. The pixel electrode PE penetrates the planarization layer 250 and the second insulating layer L2 to be thereby connected to the drain electrode DE of the switching device TFT. The first alignment layer AL1 configured to align the liquid-crystal molecules 213 may be arranged on the pixel electrode PE.

A light-blocking pattern BP, a color filter CF, an over-coating layer OC, and the common electrode CE are arranged over the second substrate 212. In addition, a second alignment layer AL2 configured to align the liquid-crystal molecules 213 may be arranged on the common electrode CE.

The second substrate 212 may be a glass substrate or a plastic substrate. An external surface of the second substrate 212 is a display surface DS.

The light-blocking pattern BP is arranged on the second substrate 212 in a position corresponding to an area in which the switching device TFT, a gate line, and data lines are arranged. The light-blocking pattern BP blocks light. It is to be understood that the position in which the light-blocking pattern BP is arranged in FIG. 8 is exemplary, and the present inventive concept is not limited thereto. For example, in an exemplary embodiment, the light-blocking pattern BP may be arranged on the first substrate 211.

The color filter CF is arranged on the second substrate 212, and filters color light. It is to be understood that the arrangement of the color filter CF illustrated in FIG. 8 is exemplary, and the present inventive concept is not limited thereto. For example, in an exemplary embodiment, the color filter CF may be arranged on the first substrate 211.

The over-coating layer OC is arranged over the second substrate 212 on which the color filter CF is arranged. The over-coating layer OC planarizes an upper surface of the second substrate 212. In an exemplary embodiment, the over-coating layer OC may be omitted.

The common electrode CE is arranged over the second substrate to 212 to face the pixel electrode PE. A reference voltage, that is, a common voltage, is applied to the common electrode CE, in which the reference voltage defines a polarity of a voltage applied to the pixel electrode PE. In an exemplary embodiment, the common electrode CE may have a shape of a flat plate. However, the inventive concept is not limited thereto.

The liquid-crystal layer 203 includes the liquid-crystal molecules 213. FIG. 8 shows an example in which the liquid-crystal layer 203 is a vertical-alignment liquid-crystal layer. However, the present inventive concept is not limited thereto. For example, in an exemplary embodiment, the liquid-crystal molecules 213 may be aligned in a horizontal direction and be shifted by about 90° between the pixel electrode PE and the common electrode CE.

When a voltage is applied between the pixel electrode PE and the common electrode CE, an electric field is applied to the liquid-crystal layer 203. The electric field changes the arrangement of the liquid-crystal molecules 213 to thereby adjust an amount of light passing through the liquid-crystal layer 203 so that the light-emitting panel 200 may generate light.

In an exemplary embodiment, a polarization layer 270 may be arranged on the display surface DS of the second substrate 212. In an exemplary embodiment, the polarization layer 270 may be arranged on a flat surface of the planarization layer 120 (shown in FIG. 2) of the optical filter 100 (shown in FIG. 2). When light is generated from the light-emitting panel 200, the polarization layer 270 may have the light incident on the optical filter 100 (shown in FIG. 2) in a polarized state. When the polarization layer 270 is arranged on a second surface of the substrate 110 (shown in FIG. 2), the polarization layer 270 polarizes light having passed through the optical filter 100 (shown in FIG. 2). In this case, as the light passes through the optical filter 100 (shown in FIG. 2), since scattering, etc. occurs, it may be difficult to generate accurate polarization by using the polarization layer 270. Accordingly, the polarization layer 270 may be arranged between the light-emitting panel 200 and the optical filter 100 (shown in FIG. 2).

According to exemplary embodiments of the present inventive concept, a display device may increase utilization of incident light by decreasing incident light that may not excite quantum dots (e.g., incident light that is filtered out), to thereby improve color reproducibility and light efficiency.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. An optical filter, comprising:
   a substrate comprising a plurality of pixel areas spaced apart from each other and a light-blocking area arranged between the plurality of pixel areas;
   a plurality of color filters arranged on a first surface of the substrate and corresponding to the plurality of pixel areas;
   a plurality of conversion layers arranged on the first surface of the substrate and corresponding to the plurality of color filters, wherein each of the conversion layers comprises at least one inclined side surface; and
   a reflective layer arranged on the at least one inclined side surface of each of the plurality of conversion layers,
   wherein the reflective layer extends to the light-blocking area and is arranged consecutively on two adjacent inclined side surfaces from among the inclined side surfaces of the plurality of conversion layers and the light-blocking area between the two adjacent inclined side surfaces,
   wherein the plurality of color filters comprises a first color filter, a second color filter and a third color filter, wherein each of the color filters transmits light of a different color, and
   wherein the second color filter comprises a protruding portion extending away from a remaining portion of the second color filter in a direction parallel to the substrate, and the protruding portion overlaps a portion of the third color filter in the light-blocking area to form a partition wall in a trench disposed between the two adjacent inclined side surfaces of the plurality of conversion layers, wherein, in the trench, the third color filter comprises a first inclined side surface disposed on one of the two adjacent inclined side surfaces of the plurality of conversion layers, a second inclined side surface disposed on the other one of the two adjacent inclined side surfaces of the plurality of conversion layers, and an upper surface extending in the direction parallel to the substrate and disposed below the protruding portion of the second color filter.

2. The optical filter of claim 1, wherein a horizontal cross-sectional area of at least one of the plurality of conversion layers decreases in a direction away from the substrate.

3. The optical filter of claim 1, wherein the color filters are spaced apart from each other, and
the reflective layer extends to a portion between two neighboring color filters from among the plurality of color filters.

4. The optical filter of claim 3, wherein the reflective layer is arranged between side surfaces of the two neighboring color filters.

5. The optical filter of claim 1, wherein the plurality of conversion layers is arranged in concave portions defined by the partition wall.

6. The optical filter of claim 1, wherein the reflective layer covers an upper surface of the partition wall.

7. The optical filter of claim 1, further comprising:
a planarization layer providing a flat surface by covering the plurality of conversion layers.

8. The optical filter of claim 1, wherein the plurality of conversion layers comprises:
a first conversion layer;
a second conversion layer; and
a third conversion layer,
wherein each of the conversion layers comprises scattering particles,
the first conversion layer further comprises first quantum dots, and the second conversion layer further comprises second quantum dots, and
the first quantum dots and the second quantum dots comprise a same material and have different sizes.

9. A display device, comprising:
a light-emitting panel configured to emit incident light of a single color; and
an optical filter configured to convert the incident light into light of different colors,
wherein the optical filter comprises:
a substrate comprising a plurality of pixel areas spaced apart from each other and a light-blocking area arranged between the plurality of pixel areas;
a plurality of color filters arranged on a first surface of the substrate and corresponding to the plurality of pixel areas, wherein the first surface of the substrate faces the light-emitting panel;
a plurality of conversion layers arranged on the first surface of the substrate and corresponding to the plurality of color filters, wherein the incident light is incident on the plurality of conversion layers;
a reflective layer arranged on inclined side surfaces of the plurality of conversion layers; and
a low refractive index layer arranged between the plurality of color filters and the plurality of conversion layers, wherein the reflective layer extends to the light-blocking area and is arranged on the inclined side surfaces of the plurality of conversion layers and in the light-blocking area between the plurality of conversion layers, wherein the plurality of color filters comprises a first color filter, a second color filter and a third color filter, wherein each of the color filters transmits light of a different color, and wherein the second color filter comprises a protruding portion extending away from a remaining portion of the second color filter in a direction parallel to the substrate, and the protruding portion overlaps a portion of the third color filter in the light-blocking area to form a partition wall in a trench disposed between two adjacent inclined side surfaces of the plurality of conversion layers, wherein, in the trench, the third color filter comprises a first inclined side surface disposed on one of the two adjacent inclined side surfaces of the plurality of conversion layers, a second inclined side surface disposed on the other one of the two adjacent inclined side surfaces of the plurality of conversion layers, and an upper surface extending in the direction parallel to the substrate and disposed below the protruding portion of the second color filter.

10. The display device of claim 9, wherein the light-emitting panel comprises:
a plurality of light-emitting devices configured to generate the incident light of a single color,
wherein the light-emitting devices are arranged to correspond to the plurality of pixel areas.

11. The display device of claim 9, wherein the light-emitting panel comprises a liquid-crystal layer comprising a plurality of liquid-crystal molecules, and
the optical filter further comprises a planarization layer providing a flat surface by covering the plurality of conversion layers,
wherein the display device further comprises a polarization layer arranged between the light-emitting panel and the planarization layer.

12. The display device of claim 9, wherein each of the plurality of conversion layers comprises an inclined side surface, and
horizontal cross-sectional areas of the plurality of conversion layers decrease in a direction away from the substrate.

13. The display device of claim 9, wherein the reflective layer covers an upper surface of the partition wall, wherein the upper surface of the partition wall faces the light-emitting panel.

14. The display device of claim 9, wherein the plurality of conversion layers comprises:
a first conversion layer;
a second conversion layer; and
a third conversion layer,
wherein each of the conversion layers comprises scattering particles,
the first conversion layer further comprises first quantum dots, and the second conversion layer further comprises second quantum dots, and
the first quantum dots and the second quantum dots comprise a same material and have different sizes.

15. The display device of claim 14, wherein colors of light that passes through the first conversion layer, the second conversion layer, and the third conversion layer are different from each other, and the color of the light that passes through the third conversion layer is identical to a color of the incident light.

16. The display device of claim 9, wherein the low refractive index layer has a refractive index equal to or less than about 1.2.

17. The optical filter of claim 1, further comprising:
a low refractive index layer arranged between the plurality of color filters and the plurality of conversion layers, and having a refractive index equal to or less than about 1.2.

18. The optical filter of claim 17, further comprising:
a barrier layer arranged between the low refractive index layer and the plurality of conversion layers, and comprising silicon nitride and/or silicon oxide.

19. The optical filter of claim 9, further comprising:
a barrier layer arranged between the low refractive index layer and the plurality of conversion layers, and comprising silicon nitride and/or silicon oxide.

20. The optical filter of claim 9, further comprising:
a planarization layer disposed between the light-emitting panel and the plurality of conversion layers.

\* \* \* \* \*